(12) United States Patent
McCollum

(10) Patent No.: US 10,553,646 B2
(45) Date of Patent: Feb. 4, 2020

(54) CIRCUIT AND LAYOUT FOR RESISTIVE RANDOM-ACCESS MEMORY ARRAYS

(71) Applicant: Microsemi SoC Corp., San Jose, CA (US)

(72) Inventor: John L. McCollum, Orem, UT (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 16/155,141

(22) Filed: Oct. 9, 2018

(65) Prior Publication Data

US 2020/0006430 A1 Jan. 2, 2020

Related U.S. Application Data

(60) Provisional application No. 62/691,566, filed on Jun. 28, 2018.

(51) Int. Cl.
*H01L 27/24* (2006.01)
*H01L 45/00* (2006.01)
(Continued)

(52) U.S. Cl.
CPC ...... *H01L 27/2463* (2013.01); *G11C 13/0011* (2013.01); *H01L 27/2436* (2013.01);
(Continued)

(58) Field of Classification Search
CPC ............. H01L 27/2436; H01L 27/2463; H01L 45/1233; H01L 45/08; G11C 13/0011
See application file for complete search history.

(56) References Cited

U.S. PATENT DOCUMENTS 8,665,629 B2 * 3/2014 Park ...................... H01L 27/228
365/148
9,472,272 B2 * 10/2016 Gopinath ............ G11C 13/0011
(Continued)

FOREIGN PATENT DOCUMENTS

| EP | 2043156 A2 | 4/2009 |
| EP | 3244417 A1 | 11/2017 |
| WO | 2016133661 A1 | 8/2016 |

OTHER PUBLICATIONS

PCT/US2019/027759, International Search Report and Written Opinion, dated Jul. 18, 2019.
(Continued)

*Primary Examiner* — Allison Bernstein
(74) *Attorney, Agent, or Firm* — Glass and Associates; Kenneth Glass; Kenneth D'Alessandro

(57) ABSTRACT

A ReRAM memory array includes rows and columns of ReRAM cells. Each ReRAM cell in a row and column of the array includes a ReRAM device having an ion source end coupled to a bias line associated with the row of the array containing the ReRAM device. A first transistor is coupled between the solid electrolyte end of the ReRAM device and a bit line associated with the column of the array containing the ReRAM cell. The first transistor has a gate coupled to a first word line associated with the row containing the ReRAM cell. A second transistor is coupled between the solid electrolyte end of the ReRAM device and the bit line associated with the column of the array containing the ReRAM cell. The second transistor has a gate coupled to a second word line associated with the row containing the ReRAM cell.

6 Claims, 7 Drawing Sheets

(51) Int. Cl.
  *G11C 13/00* (2006.01)
  *H01L 29/78* (2006.01)
(52) U.S. Cl.
  CPC .......... *H01L 45/08* (2013.01); *H01L 45/1233*
    (2013.01); *G11C 13/004* (2013.01); *G11C*
    *13/0069* (2013.01); *G11C 13/0097* (2013.01);
    *G11C 2013/005* (2013.01); *G11C 2013/009*
    (2013.01); *G11C 2213/56* (2013.01); *G11C*
    *2213/79* (2013.01); *H01L 29/785* (2013.01)

(56) References Cited

U.S. PATENT DOCUMENTS

| | | |
|---|---|---|
| 2011/0228594 A1 | 9/2011 | Rao et al. |
| 2013/0148409 A1 | 6/2013 | Chung |
| 2015/0243668 A1 | 8/2015 | Ueda et al. |

OTHER PUBLICATIONS

PCT/US2019/027761 International Search Report and Written Opinion, dated Jul. 17, 2019.

\* cited by examiner

CIRCUIT AND LAYOUT FOR RESISTIVE RANDOM-ACCESS MEMORY ARRAYS

BACKGROUND

The present invention relates to integrated circuit technology and to resistive random-access memory (ReRAM) technology. More particularly, the present invention relates to integrated circuit layouts for addressable arrays of ReRAM memory cells employing small geometry transistor devices such as FinFET transistor devices. ReRAM memory cells have been employed as configuration memory for user-programmable integrated circuits by driving a switch transistor that configures a programmable circuit. ReRAM memory cells have also been used as random-access memory (RAM) in integrated circuits. The present invention relates to ReRAM memory cells used in integrated circuits as random-access memory (RAM) cells that have to be addressed and coupled to sense amplifiers to read the data they contain.

Because small geometry transistor devices such as FinFET transistors cannot individually support the voltages necessary for programming and erasing ReRAM devices, two FinFET transistors have been placed in series in addressable ReRAM memory cells.

Referring first of all to FIGS. 1, 2A and 2B, a schematic diagram of a portion 10 of a prior-art ReRAM memory array, a top view of a layout of a portion of the memory array 10 shown in FIG. 1, and a cross-sectional view of the layout of the portion of the memory array shown in FIG. 2A taken through lines 2B-2B are shown, respectively. In FIG. 1, a portion 10 of a prior-art ReRAM memory array includes six ReRAM memory cells (indicated in dashed lines at reference numerals 12a through 12f, respectively). ReRAM memory cells 12a, 12b, and 12c are in a first column of the array and ReRAM memory cells 12d, 12e, and 12f are in a second column of the array. Persons of ordinary skill in the art will observe that the layout of the memory cells 12a through 12f is a mirror configuration. Thus, in the first column of the array memory cells 12a and 12b mirror each other do memory cells 12b and 12c Similar mirroring exists in the second column of the array.

Each memory cell 12a through 12f includes a ReRAM device and two series-connected transistor devices. These circuit elements will be designated using the letter suffixes corresponding to the memory cells in which they are disposed. As an example, ReRAM memory cell 12a includes ReRAM device 14a, and two n-channel FinFET transistor devices 16a and 18a all connected in series between a first common bias node 20-1 and a first bit line BL0 at reference numeral 22-1 associated with a first column of the portion 10 of the array. The convention used in the drawing symbol of the ReRAM devices herein is that the wider end of the ReRAM device is the ion source side of the device and the narrower end is the opposing electrode, which is separated from the ion source by a solid electrolyte layer. To program a ReRAM device, i.e., to set it to a lower resistance, a programming voltage is applied with the most positive potential applied to the wider end of the ReRAM device. To erase a ReRAM device, i.e., to set it to a high resistance, a programming voltage is applied with the most positive potential applied to the narrower end of the ReRAM device.

ReRAM memory cell 12b includes ReRAM device 14b, and two n-channel FinFET transistor devices 16b and 18b all connected in series between a second common bias node 20-2 and the first bit line 22-1. ReRAM memory cell 12c includes ReRAM device 14c, and two n-channel FinFET transistor devices 16c and 18c all connected in series between the second common bias node 20-2 and the first bit line 22-1. The ReRAM cells 12d, 12e, and 12f are similarly connected except that they are connected between the common bias nodes 20-1 and 20-2, respectively, and a second bit line 22-2 associated with a second column of the portion 10 of the array.

The gates of the two FinFET transistors in each row of the array are connected in common to a word line. Thus, the FinFET transistors 16a and 18a and 16d and 18d are connected together to a word line WL0 at reference numeral 24. The word line 24 is shown in two sections, each of which represents a gate line formed from, for example, a metal or metal silicide, that runs the length of the row in the array containing the ReRAM memory cells 12a and 12d. These gate lines are stitched together as represented by connection 26. Similarly, the gates of the FinFET transistors 16b and 18b and 16e and 18e are connected together to the word lines WL1 at reference numeral 28. These gate lines are stitched together as represented by connection 30. The gates of the FinFET transistors 16c and 18c and 16f and 18f are connected together to the word lines WL2 at reference numeral 32. These gate lines are stitched together as represented by connection 34.

Referring now to both FIGS. 2A and 2B, diagrams show a typical layout 40 for an implementation in an integrated circuit of ReRAM memory cells like those of FIG. 1A. The portion of the ReRAM array depicted in FIGS. 2A and 2B is shown within dashed lines 36 of FIG. 1. Accordingly, persons of ordinary skill in the art will note that the layout depicted in FIGS. 2A and 2B do not include the ReRAM cells 12c and 12f depicted in FIG. 1. Where elements of FIG. 1 are depicted in FIGS. 2A and 2B, they will be designated using the same reference numerals used for these elements in FIG. 1.

A first group of fins 42, represented as a diffusion in FIG. 2A for simplicity, forms the source, drains, and channels for the FinFET transistors 16a, 18a, 16b, and 18b of the first column of the array and a second the group of fins 44 forms the source, drains, and channels for the FinFET transistors 16d, 18d, 16e, and 18e in the second column of the array. Dashed lines indicated at reference numerals 12a, 12b, 12d, and 12e in FIG. 2A show the locations of ReRAM memory cells 12a, 12b, 12d, and 12e of FIG. 1.

Gate electrode line 46 forms the gates for FinFET transistors 16a and 16d, and serves as word line WL0. Gate line 48 forms the gates for FinFET transistors 18a and 18d and also serves as word line WL0 (as shown in FIG. 1 and FIG. 2A by connection 26). Gate electrode line 50 forms the gates for FinFET transistors 16b and 16e and serves as word line WL1. Gate electrode line 52 forms the gates for FinFET transistors 18b and 18e and also serves as word line WL1 (as shown in FIG. 1 and FIG. 2A by connection 30). Gate electrode lines 46, 48, 50, and 52 are formed from metal as is known in the FinFET fabrication art.

FinFET technology requires a dummy gate electrode to terminate the ends of a diffusion region to isolate it from adjoining diffusion regions. The dummy gate electrodes are formed at the same time as and in the same manner as the gate electrode lines 46, 48, 50, and 52, and are referred to as dummy gate electrodes because no transistors are formed under them. Dummy gate electrode line 54 provides isolation between ReRAM devices 14a, 14d and ReRAM devices (not shown) that are disposed above dummy gate electrode line 54. Similarly, dummy gate electrode line 56 provides isolation between ReRAM devices 14b, 14e and ReRAM devices (not shown) that are disposed below gate electrode line 56.

Reference numerals 58 in FIG. 2B indicate the gate dielectric layers below the gate electrode lines 46, 48, 50, 54, and 56. Contacts 60 and 62 connect the gate electrode lines 46 and 48 to a metal level 0 (M0) segment 64 (identified as stitch connection 26 in FIG. 1) that connects the gates of FinFETs 16a and 18a together. Contacts 66 and 68 connect the gate lines 50 and 52 to a M0 segment 70 (identified as stitch connection 30 in FIG. 1) that connects the gates of FinFETs 16b and 18b together.

Metal level 0 (M0) segment 72-1 is connected to the group of fins 42 by contact 74 shown in FIG. 2B. Contact 76 connects M0 segment 72-1 to a metal level 1 (M1) segment 78. Contact 80 connects M1 segment 78 to a metal level 2 (M2) segment 82. Contact 84, shown in both FIGS. 2A and 2B connects M2 segment 82 to a metal level 3 (M3) segment 86 that serves as the bit line 22-1 in FIG. 1. Metal segments 78 and 82 and contacts 76 and 80 are not shown in FIG. 2A to avoid overcomplicating the drawing.

Metal layer 2 segment 88 serves as the first common bias node 20-1 in FIG. 1. A contact 90-1 connects the M2 segment 88 to the ReRAM 14a of FIG. 1, shown in FIG. 2A and also shown in FIG. 2B as including an ion source layer 92 and solid electrolyte layer 94. Persons skilled in the art will appreciate that the ReRAM devices are known and are more complicated that as shown in FIG. 2B. As shown in FIG. 2B, the ReRAM device 14a is connected to FinFET transistor 16a through contact 96 to M1 layer segment 98, contact 100 to M0 segment 102-1, and contact 104.

Metal layer 2 segment 106 serves as the second common bias node 20-2 in FIG. 1. a contact 90-2 connects the M2 segment 106 to the ReRAM 14b of FIG. 1, shown in FIG. 2A and also shown in FIG. 2B as including an ion source layer 108 and solid electrolyte layer 110. Persons skilled in the art will appreciate that the ReRAM devices are known and are more complicated that as shown in FIG. 2B. As shown in FIG. 2B, the ReRAM device 14b is connected to FinFET transistor 16b through contact 112 to M1 layer segment 114, contact 116 to M0 segment 102-2, and contact 118.

To program ReRAM device 14a in memory cell 12a in FIG. 1, a positive voltage is applied to word line WL0 24 to turn on transistors 16a and 18a and a voltage is applied between bias line 20-1 and bit line 0 22-1 with the more positive potential applied to bias line 20-1. To erase ReRAM device 14a in memory cell 12a in FIG. 1, a positive voltage is applied to word line WL0 24 to turn on transistors 16a and 18a and a voltage is applied between bias line 20-1 and bit line 0 22-1 with the more positive potential applied to bit line 0 22-1. To inhibit programming/erasing of ReRAM devices 14b and 14c in memory cells 12b and 12c, word lines WL1 28 and WL2 32 are turned off. To inhibit programming/erasing of ReRAM devices 14d, 14e, and 14f in memory cells 12d, 12e, and 12f the voltage at bit line 1 22-2 is set to the same voltage as bias line 0 20-1.

Under the biasing conditions that are present for programming a ReRAM memory cell (using memory cell 12a as an example), the transistors 16a and 18a are in common source configuration which provides current limiting. In addition, since both transistors 16a and 18a are turned on, the voltage across them is close to zero resulting in little or no stress on these transistors. In the reverse direction for erasing a ReRAM device (using memory cell 12a as an example), there is no current limiting because neither of the FinFET transistors of the selected ReRAM cell is connected to ground (i.e., in common source configuration) and the changing resistance of the ReRAM device 14a places a source bias on the transistors 16a and 18a, reducing their current handling capabilities. In addition, a higher voltage is present across the transistors 16a and 18a than during programming, requiring a larger number of FinFET transistors to support the voltage. This requirement places a limit on the area minimization of ReRAM memory cells.

In addition, ReRAM memory cells require programming and erase currents of about 100 µA or more. In order to provide such current, the programming and erase paths must have an impedance low enough to allow programming and erase currents of this magnitude to flow. As device sizes decrease, the transistors used become smaller and weaker and wider metal lines are needed to supply the necessary programming potentials. In addition, as noted above with respect to FIG. 2A, prior-art ReRAM memory arrays employing ReRAM memory cells fabricated using deep submicron lines (i.e., FinFET transistor devices) require quantized layout rules that employ the additional dummy gate lines (e.g., dummy gate lines 54 and 56 in FIG. 2A) to terminate diffusion regions between cells.

BRIEF DESCRIPTION

According to one aspect of the present invention, a ReRAM memory array includes rows and columns of ReRAM cells. Each ReRAM cell in a row and column of ReRAM cells includes a ReRAM device having an ion source end and a solid electrolyte end, the ion source end coupled to a bias line associated with the row of the array containing the ReRAM device, a first transistor coupled between the solid electrolyte end of the ReRAM device and a bit line associated with the column of the array containing the ReRAM cell, the first transistor having a gate coupled to a first word line associated with the row containing the ReRAM cell, and a second transistor coupled between the solid electrolyte end of the ReRAM device and the bit line associated with the column of the array containing the ReRAM cell, the second transistor having a gate coupled to a second word line associated with the row containing the ReRAM cell.

According to another aspect of the invention, a layout is presented for a ReRAM memory array including rows and columns of ReRAM cell. For each column of the array a group of fins is formed in a semiconductor substrate and running in a first direction. For each column of the array a bit line in the form of a metal interconnect line running in the first direction is formed. For each row in the array first and second spaced-apart word lines running in a second direction perpendicular to the first direction are formed. The first word line passes over and electrically insulated from each group of fins and forming gates for a first transistor in ReRAM memory cells in a row of the array. The second word line passes over and electrically insulated from each group of fins and forming gates for second transistors in ReRAM memory cells in the row of the array. For each row of the array there is a bias line in the form of a metal interconnect line running in the second direction. A plurality of ReRAM memory cells are formed, each ReRAM memory cell is located at an intersection of a row and a column of the array, each memory cell including a ReRAM device formed over the group of fins between the first and second word lines having a solid electrolyte end and an ion source end, the solid electrolyte end of each ReRAM device electrically connected to a region of the group of fins for the column of the array containing the memory cell at a location between the first and second word lines for the row containing the memory cell, the ion source end of each ReRAM device is electrically connected to the bias line for the row containing the memory cell. The region of the group of fins electrically connected to the solid electrolyte end of each ReRAM device forms common drains for the first and second transistors in the ReRAM cell. Regions of the group of fins outside of the pair of spaced apart word lines form separate source regions for the first and second transistors in the ReRAM cell and are electrically connected to the bias line for the row containing the ReRAM memory cells.

According to another aspect of the present invention, except for end regions of the group of fins, the regions of the group of fins outside of the pair of spaced apart word lines, and also form a common source region for one of a first and second a transistor in another memory cell in the column containing the ReRAM memory cell adjacent to the memory cells.

BRIEF DESCRIPTION OF THE DRAWING FIGURES

The invention will be explained in more detail in the following with reference to embodiments and to the drawing in which are shown:

DETAILED DESCRIPTION

Persons of ordinary skill in the art will realize that the following description of the present invention is illustrative only and not in any way limiting. Other embodiments of the invention will readily suggest themselves to such skilled persons.

Figure 3:
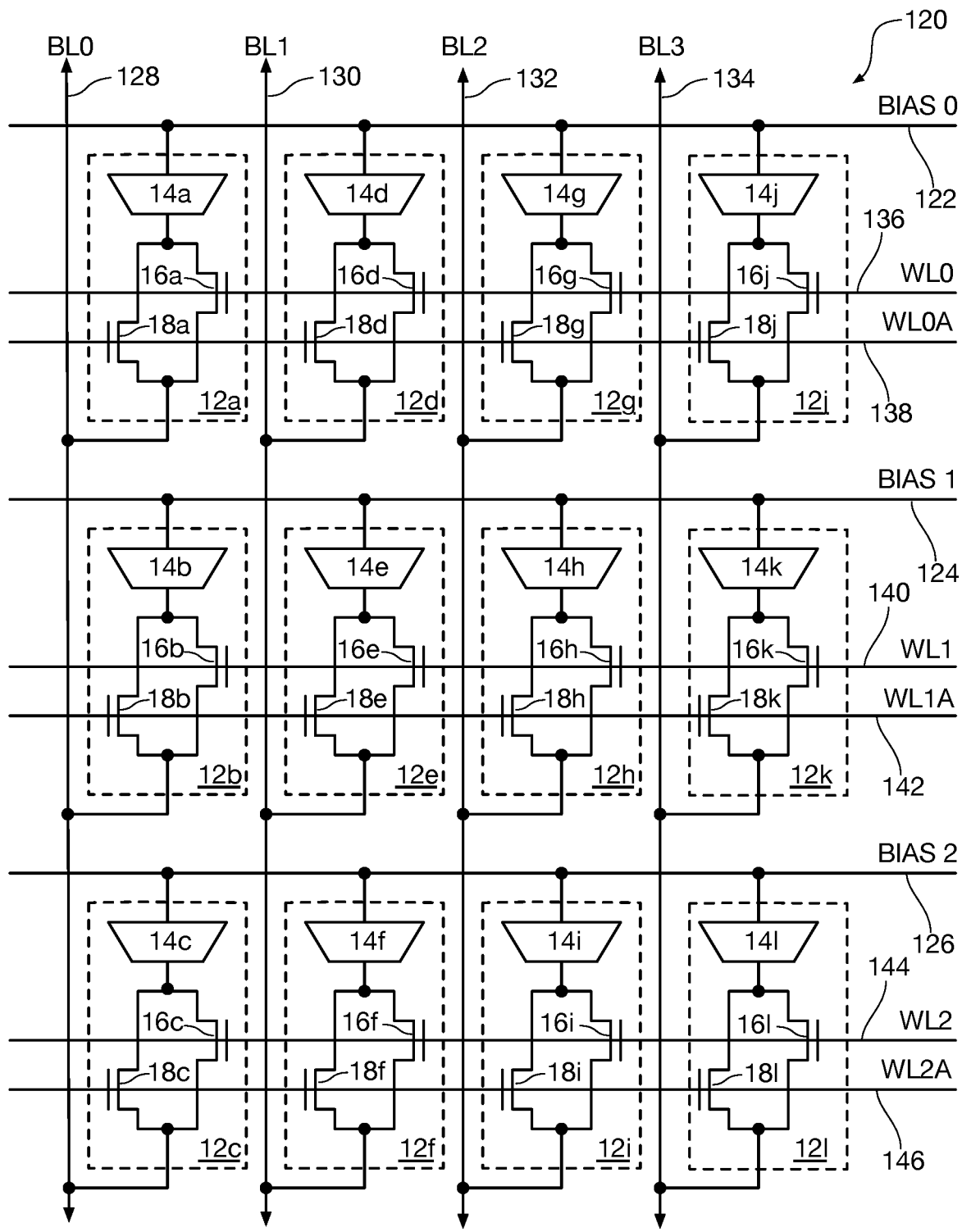
FIG. 3 is a schematic diagram of a portion of a ReRAM memory array in accordance with one aspect of the present invention.

Referring now to FIG. 3, a schematic diagram shows a portion 120 of a ReRAM memory array in accordance with one aspect of the present invention. Various circuit elements in the embodiment of FIG. 3 correspond to circuit elements in the prior-art array of FIG. 1 and will be referred to using the same reference numerals used to identify those circuit elements in FIG. 1. Each memory cell includes a ReRAM device and first and second FinFET transistor devices. These circuit elements will be designated using the letter suffixes corresponding to the memory cells in which they are disposed. As an example, ReRAM memory cell 12a includes ReRAM device 14a, and a first n-channel FinFET transistor device 16a and a second FinFET transistor device 18a.

In FIG. 3, the portion 120 of a ReRAM memory array in accordance with this illustrative embodiment of the invention includes twelve ReRAM memory cells (indicated in dashed lines at reference numerals 12a through 12l, respectively). ReRAM memory cells 12a, 12b, and 12c are in a first column of the array, ReRAM memory cells 12d, 12e, and 12f are in a second column of the array, ReRAM memory cells 12g, 12h, and 12i are in a third column of the array, and ReRAM memory cells 12j, 12k, and 12l are in a fourth column of the array.

In the illustrative embodiment of FIG. 3, the ReRAM devices in each row of the array have their ion source ends coupled to a bias line associated with the respective row of the array. The ion source ends of ReRAM devices 14a, 14d, 14g, and 14j in the first row of the array portion are connected to a first bias line BIAS 0 122. The ion source ends of ReRAM devices 14b, 14e, 14h, and 14k in the second row of the array portion are connected to a second bias line BIAS 1 124. The ion source ends of ReRAM devices 14c, 14f, 14i, and 14l in the third row of the array portion are connected to a third bias line BIAS 2 126.

In each memory cell in the array, the drains of the first and second FinFET transistors are connected together to the solid electrolyte ends of the ReRAM device. The sources of the first and second FinFET transistors in each memory cell are connected together to a bit line associated with the column of the array in which the memory cell is located. The gates of all of the first FinFET transistors in a row are connected to a first word line associated with that row and the gates of all of the second FinFET transistors in a row are connected to a second word line associated with that row.

In the first column of the first row of the portion of the array 120 depicted in FIG. 3, both FinFET transistors 16a and 18a are connected between the solid electrolyte end of the ReRAM device 14a and a first bit line (BL0) 128 associated with the first column of the portion 120 of the array. In the second column of the first row of the portion 120 of the array 120 depicted in FIG. 3, both FinFET transistors 16d and 18d are connected between the solid electrolyte end of the ReRAM device 14d and a second bit line (BL1) 130 associated with the second column of the portion 120 of the array. In the third column of the first row of the portion of the array 120 depicted in FIG. 3, both FinFET transistors 16g and 18g are connected between the solid electrolyte end of the ReRAM device 14g and a third bit line (BL2) 132 associated with the third column of the portion 120 of the array. In the fourth column of the first row of the portion of the array 120 depicted in FIG. 3, both FinFET transistors 16j and 18j are connected between the solid electrolyte end of the ReRAM device 14j and a fourth bit line (BL3) 134 associated with the fourth column of the portion 120 of the array.

The gates of first FinFET transistors 16a, 16d, 16g, and 16j are connected to a word line WL0 136. The gates of second FinFET transistors 18a, 18d, 18g, and 18j are connected to a word line WL0A 138. In the second row of the array, the gates of first FinFET transistors 16b, 16e, 16h, and 16k are connected to a word line WL1 140. The gates of second FinFET transistors 18b, 18e, 18h, and 18k are connected to a word line WL1A 142. In the third row of the array, the gates of first FinFET transistors 16c, 16f, 16i, and 16l are connected to a word line WL2 144. The gates of second FinFET transistors 18c, 18f, 18i, and 18l are connected to a word line WL2A 146.

Figure 2A:
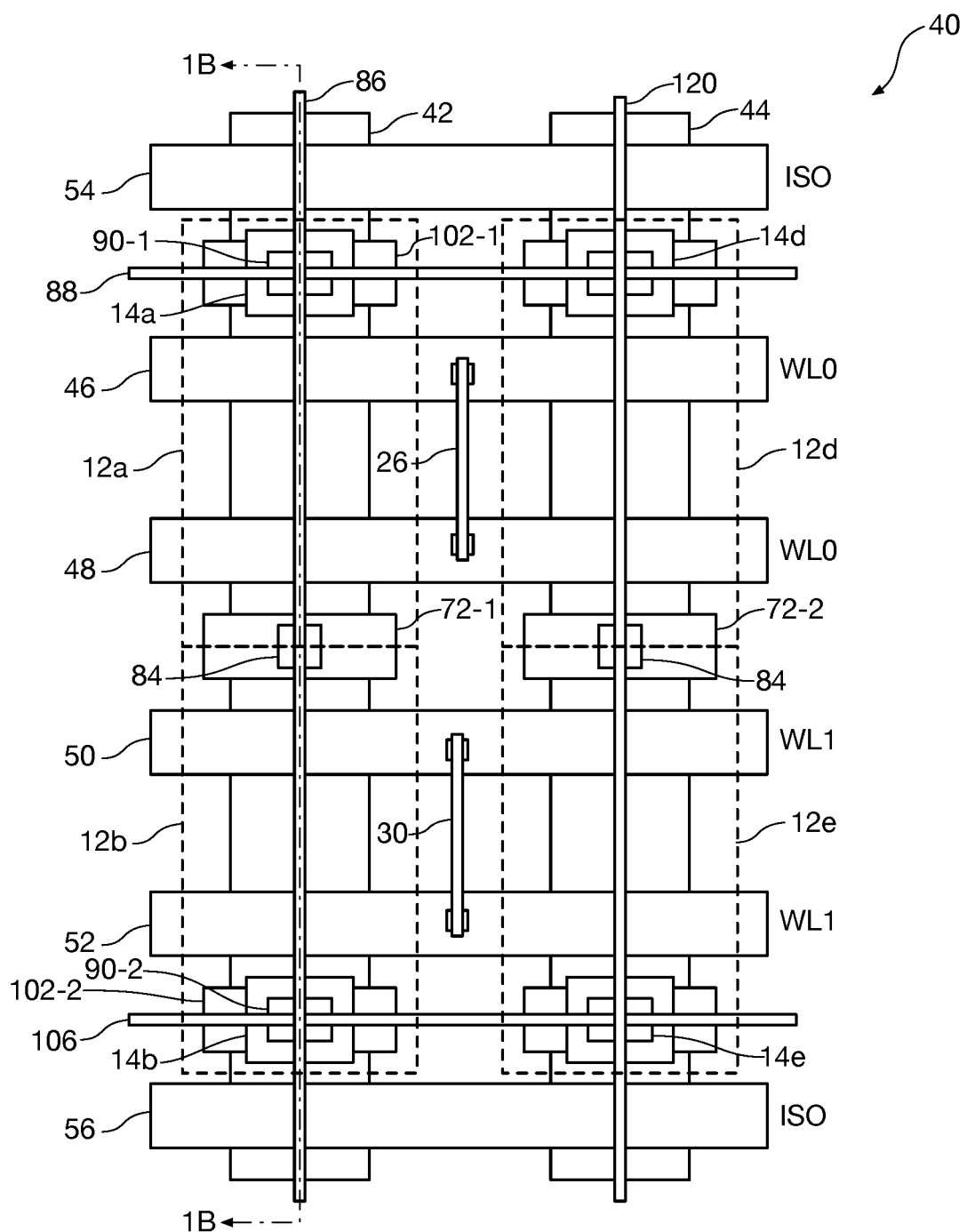
FIG. 2A is a top view of a layout of the portion of the memory array shown in FIG. 1.
Figure 2B:
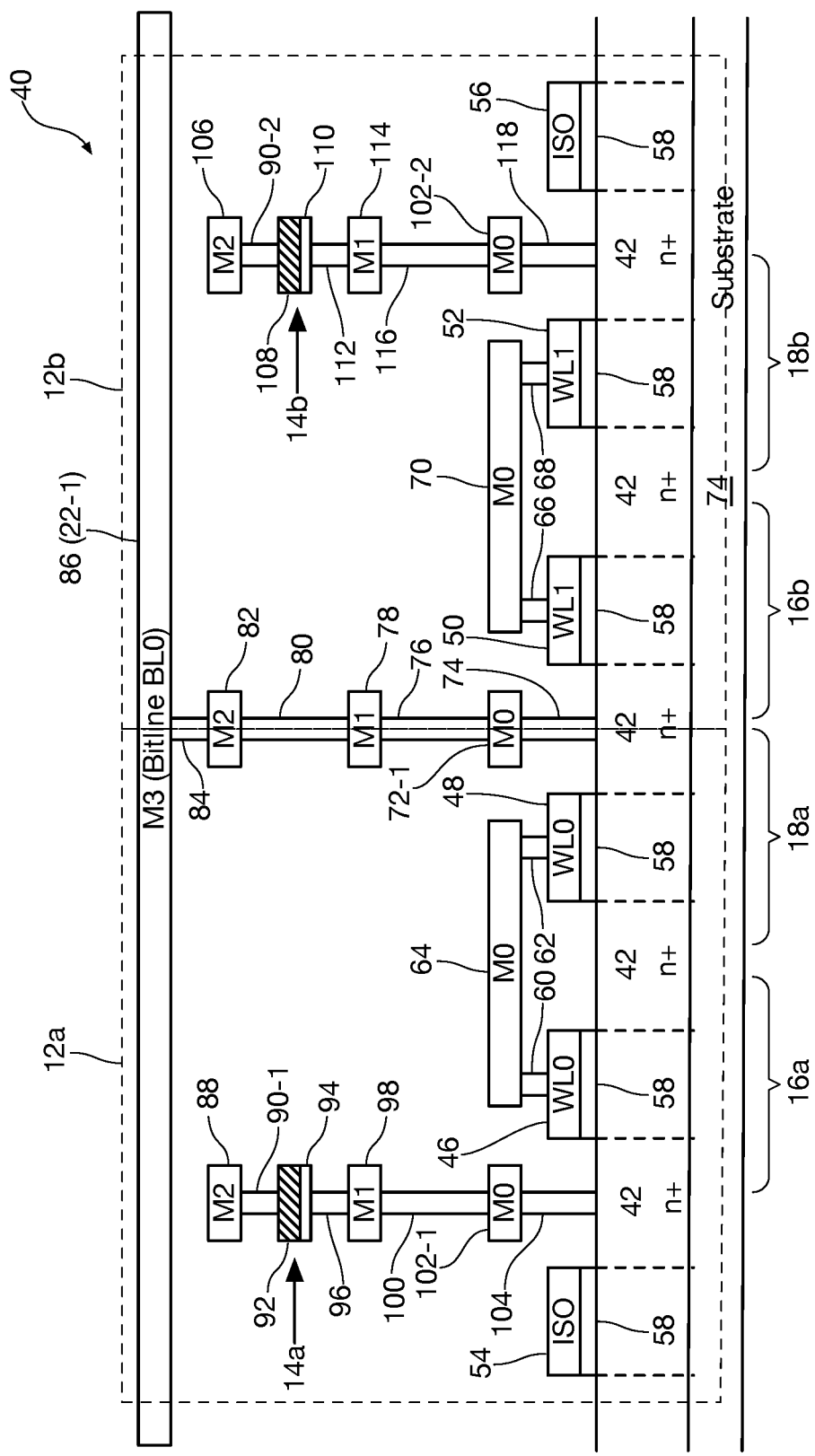
FIG. 2B is a cross-sectional view of the layout of the portion of the memory array shown in FIG. 2A taken through lines 2B-2B.
Figure 4A:
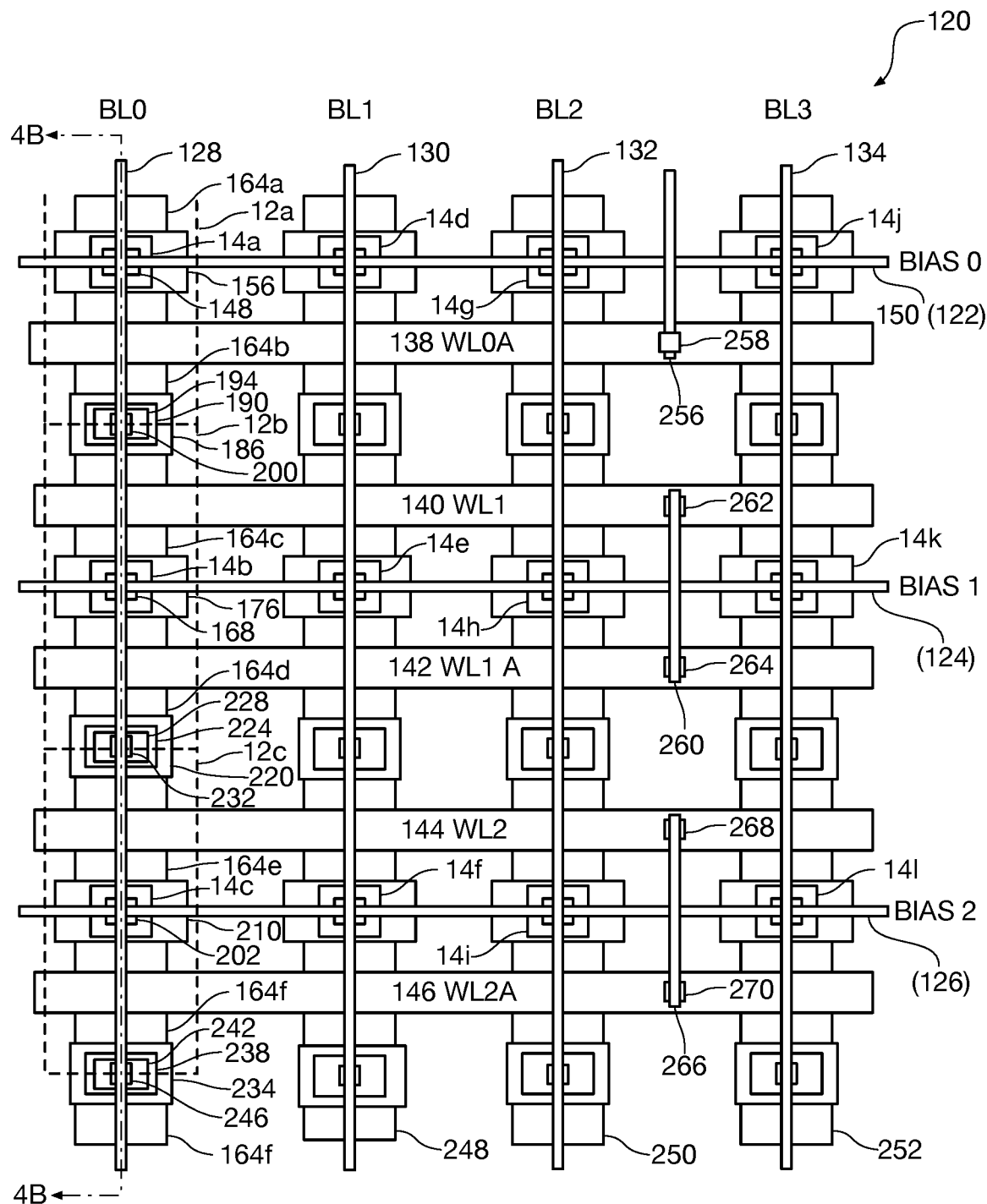
FIG. 4A is a top view of a layout of the portion of the memory array shown in FIG. 3.
Figure 4B:
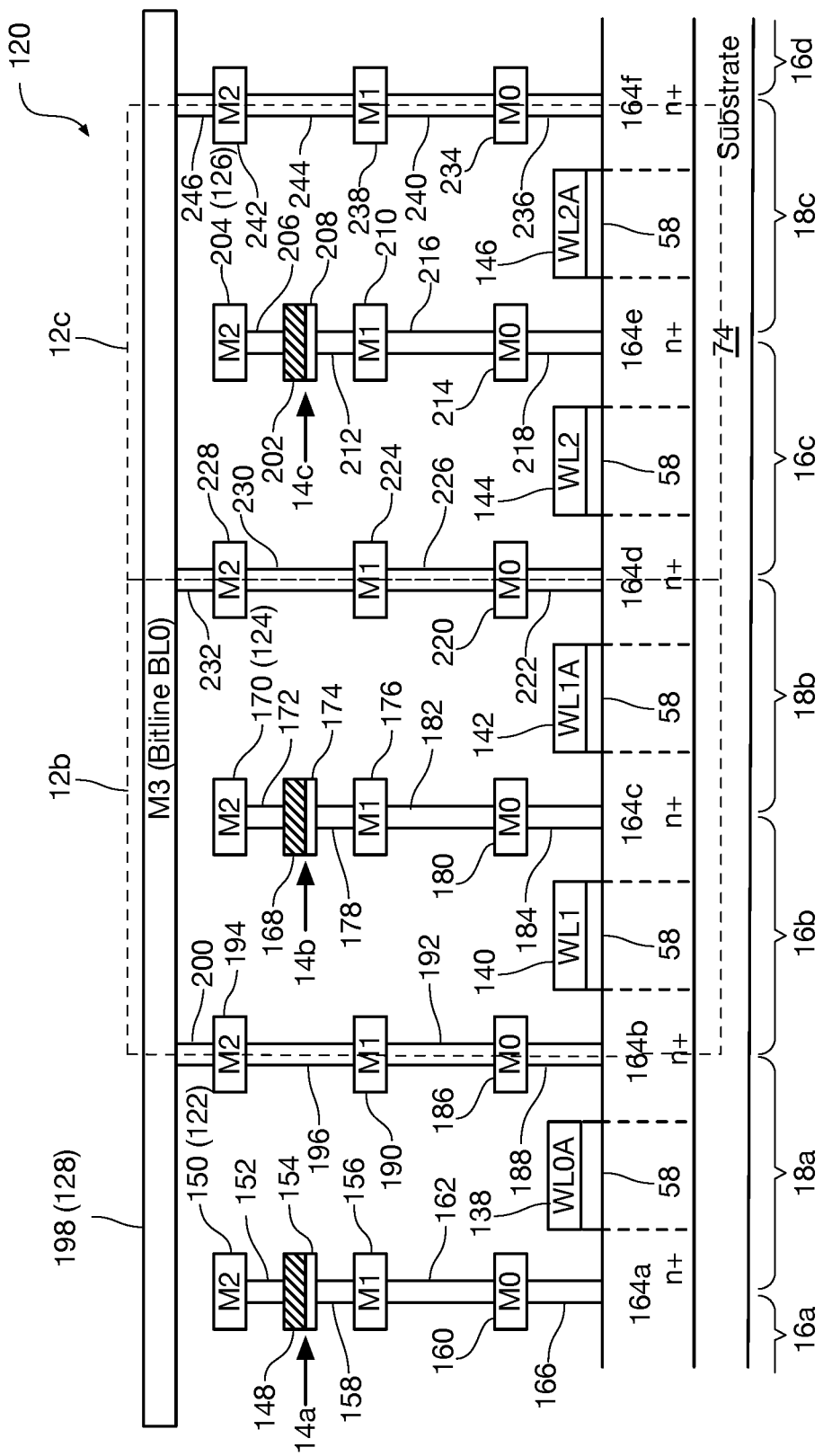
FIG. 4B is a cross-sectional view of the layout of the portion of the memory array shown in FIG. 4A taken through lines 4B-4B.

In FIG. 4A and FIG. 4B, top and cross-sectional views, respectively show an illustrative layout of the portion 120 of the memory array shown in FIG. 3. FIG. 4B is a cross-sectional view of the layout of the portion of the memory array shown in FIG. 4A taken through lines 4B-4B. Some of the circuit elements in the embodiment of FIG. 4A and FIG. 4B correspond to circuit elements in the prior-art array of FIGS. 2A and 2B and will be referred to using the same reference numerals used to identify those circuit elements in FIGS. 2A and 2B. All of the columns of the array portion 120 are identical, and only the first column will be described in detail.

Only a portion of ReRAM memory cells 12a, 12d, 12g, and 12j are shown in FIG. 4A and FIG. 4B. The ion source end 148 of ReRAM device 14a is connected to a metal level 2 (M2) segment 150 that acts as bias 0 line 122 through a contact 152. The solid electrolyte end 154 of ReRAM device 14a is connected to a metal level 1 (M1) segment 156 through a contact 158. The metal level 1 (M1) segment 156 is connected to a metal level 0 (M0) segment 160 through a contact 162. The metal level 0 (M0) segment 160 is connected to the portion of fin 164a that forms the drains of both FinFET transistor 18a and FinFET transistor 16a through a contact 166.

The ion source end 168 of ReRAM device 14b is connected to a metal level 2 (M2) segment 170 that acts as bias 1 line 124 through a contact 172. The solid electrolyte end 174 of ReRAM device 14a is connected to a metal level 1 (M1) segment 176 through a contact 178. The metal level 1 (M1) segment 176 is connected to a metal level 0 (M0) segment 180 through a contact 182. The metal level 0 (M0) segment 180 is connected to the portion of the group of fins 164c that forms the drains of both FinFET transistor 16b and FinFET transistor 18b through a contact 184.

The sources of FinFET transistors 16b and 18a are formed by the portion of the group of fins 164b that are connected to a metal level 0 (M0) segment 186 through a contact 188. The metal level 0 (M0) segment 186 is connected to a metal level 1 (M1) segment 190 through a contact 192. The metal level 1 (M1) segment 190 is connected to a metal level 2 (M2) segment 194 through a contact 196. The metal level 2 (M2) segment 194 is connected to the metal 3 segment 198 that forms the bit line BL0 128 through a contact 200. Gate electrode 138 is the gate of FinFET transistor 18a and is also word line WL0A. Gate electrode 140 is the gate of FinFET transistor 16b and is also word line WL1.

The ion source end 202 of ReRAM device 14c is connected to a metal level 2 (M2) segment 204 that acts as bias 2 line 126 through a contact 206. The solid electrolyte end 208 of ReRAM device 14a is connected to a metal level 1 (M1) segment 210 through a contact 212. The metal level 1 (M1) segment 210 is connected to a metal level 0 (M0) segment 214 through a contact 216. The metal level 0 (M0) segment 214 is connected to the portion of the group of fins 164e that forms the drains of both FinFET transistor 16c and FinFET transistor 18c through a contact 218.

The sources of FinFET transistors 16c and 18b are formed by the portion of the group of fins 164d are connected to a metal level 0 (M0) segment 220 through a contact 222. The metal level 0 (M0) segment 220 is connected to a metal level 1 (M1) segment 224 through a contact 226. The metal level 1 (M1) segment 224 is connected to a metal level 2 (M2) segment 228 through a contact 230. The metal level 2 (M2) segment 228 is connected to the metal 3 segment 198 that forms the bit line BL0 128 through a contact 232. Gate electrode 142 is the gate of FinFET transistor 18b and is also word line WL1A. Gate electrode 144 is the gate of FinFET transistor 16c and is also word line WL2.

The sources of FinFET transistors 16d and 18c formed by the portion of the group of fins 164f are connected to a metal level 0 (M0) segment 234 through a contact 236. The metal level 0 (M0) segment 234 is connected to a metal level 1 (M1) segment 238 through a contact 240. The metal level 1 (M1) segment 238 is connected to a metal level 2 (M2) segment 242 through a contact 244. The metal level 2 (M2) segment 242 is connected to the metal 3 segment 198 that forms the bit line BL0 128 through a contact 246. Gate electrode 146 is the gate of FinFET transistor 18c and is also word line WL2A.

As previously noted, word line pairs WL0 and WL0A, WL1 and WL1A, and WL2 and WL2A are connected together. These connections are shown in FIG. 4A. A metal segment 256 is connected to word line WL0A 138 by contact 258 and connects to word line WL0 (nor shown in FIG. 4A). A metal segment 260 is connected to word line WL1 140 by contact 262 and connects to word line WL1A 142 by contact 264. A metal segment 266 is connected to word line WL2 144 by contact 268 and connects to word line WL2A 146 by contact 270.

As seen in FIG. 4A, three additional columns of memory cells are shown, a second column in the array portion 120 formed on a group of fins identified at reference numeral 248 including memory cells 12d, 12e, and 12f, a third column in the array portion 120 formed on a group of fins identified at reference numeral 250 including memory cells 12g, 12h, and 12i, and a fourth column in the array portion 120 formed on a group of fins identified at reference numeral 252 including memory cells 12j, 12k, and 12l. The layouts of these additional columns of the array portion 120 are identical to the layout of the first column shown in cross sectional detail in FIG. 4B and will not be discussed in detail.

TABLE 1 shows the operating voltages that are applied to the connections to the ReRAM cells to program, erase, and read the ReRAM device 14b in ReRAM memory cell 12b of FIG. 3. The other ReRAM memory cells in FIG. 3 are shown in TABLE 1 as being unselected.

In the embodiment of FIG. 3, and as reflected in TABLE 1, word line pairs WL0/WL0A are connected together, word line pairs WL1/WL1A are connected together, and word line pairs WL2/WL2A are connected together. This is easily done by stitching together at intervals along each row the gate electrode lines that form these word line pairs as is known in the art.

TABLE 1

|  | PGM | ERASE | READ |
| --- | --- | --- | --- |
| BIAS0 | 1.2 V | 1.2 V | 0 V |
| BIAS1 | 2.4 V | 0 V | 0.5 V |
| BIAS2 | 1.2 V | 1.2 V | 0 V |
| BL0 | 0 V | 2.4 V | Sense |
| BL1 | 2.4 V | 0 V | Sense |
| BL2 | 2.4 V | 0 V | Sense |
| BL3 | 2.4 V | 0 V | Sense |
| BL4 | 2.4 V | 0 V | Sense |
| WL0/0A | 0 V | 0 V | 0 V |
| WL1/1A | 1.6 V | 2.7 V | 1.5 V |
| WL2/2A | 0 V | 0 V | 0 V |

Persons of ordinary skill in the art will observe that more than one ReRAM memory cell in a row of the array of FIG. 3, up to all of the ReRAM memory cells in a row of the array, can be programmed or erased simultaneously. For example, ReRAM device 14h in ReRAM memory cell 12h can be programmed at the same time as ReRAM device 14b in ReRAM memory cell 12b if bit line BL3 134 is brought to 0V along with bit line BL0 128. Because bias lines BIAS 0 122, BIAS1 124, and BIAS 2 126 are global to a row, all of the ReRAM memory cells in a row may be read simultaneously since all of the bit lines BL0 128, BL1 130, BL2

132, and BL3 134 are connected to sense amplifiers when the memory array is in read mode.

Figure 1:
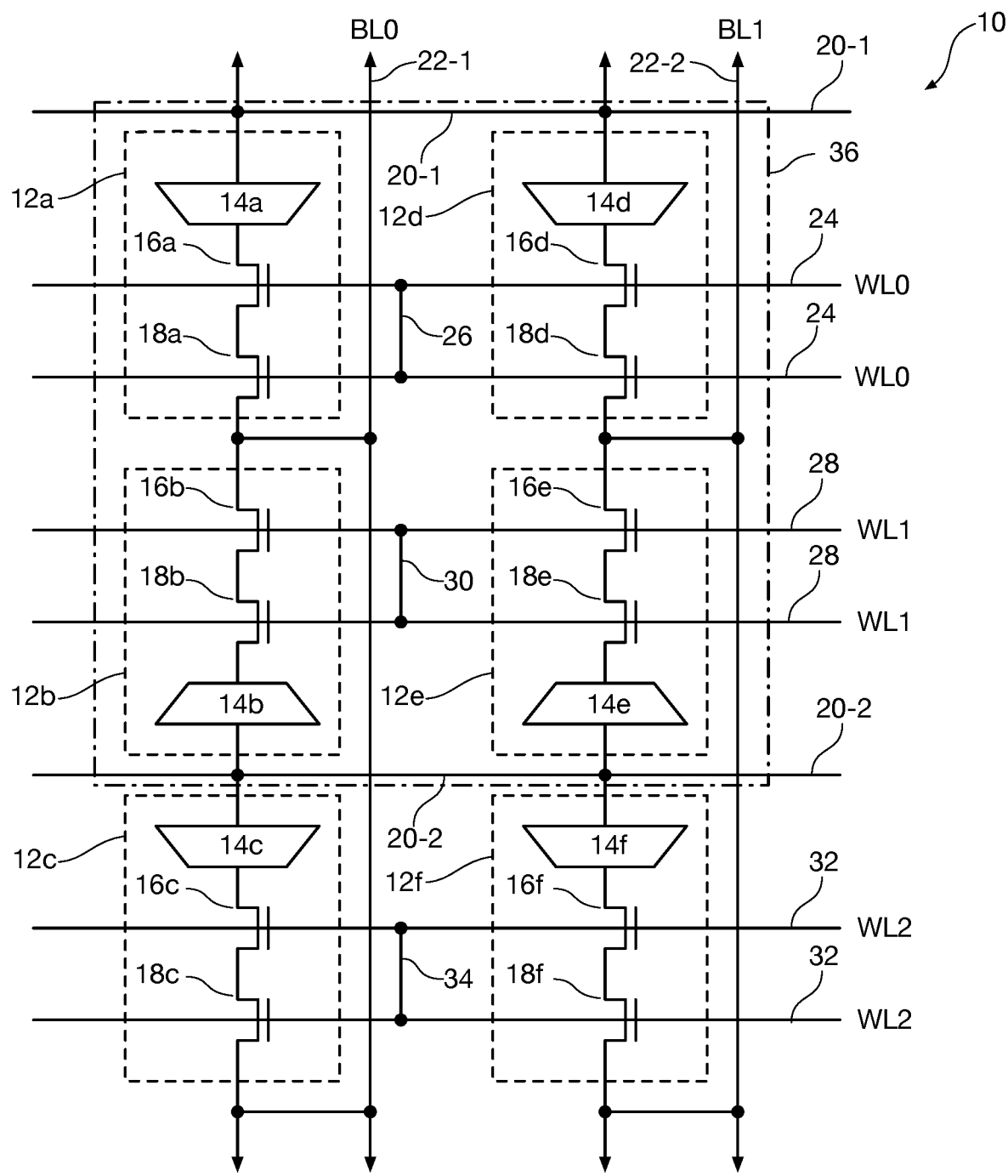
FIG. 1 is a schematic diagram of a portion of a prior-art ReRAM memory array.

An advantage of the ReRAM cells and memory arrays of the present invention is that it eliminates the need for dummy gate lines as in the prior-art ReRAM memory cells employing FinFET transistor devices allowing the cells to occupy a smaller area on the integrated circuit die as compared to the prior art represented by FIG. 1. In addition, because the FinFET transistor devices 16 and 18 for each cell are in parallel with one another, more drive current can be provided during programming and erasing. Those skilled in the art will recognize the increased stress presented to the metal bit lines and the bias lines during programming and erasing, thus requiring wider metal lines and/or shorter lengths of metal bias lines and bit lines as compared to the prior art. In addition, the bias line driver device must be a current drive device so as to prevent overdrive during programming, thus requiring it to be a larger device than a normal word line driver.

Figure 5:
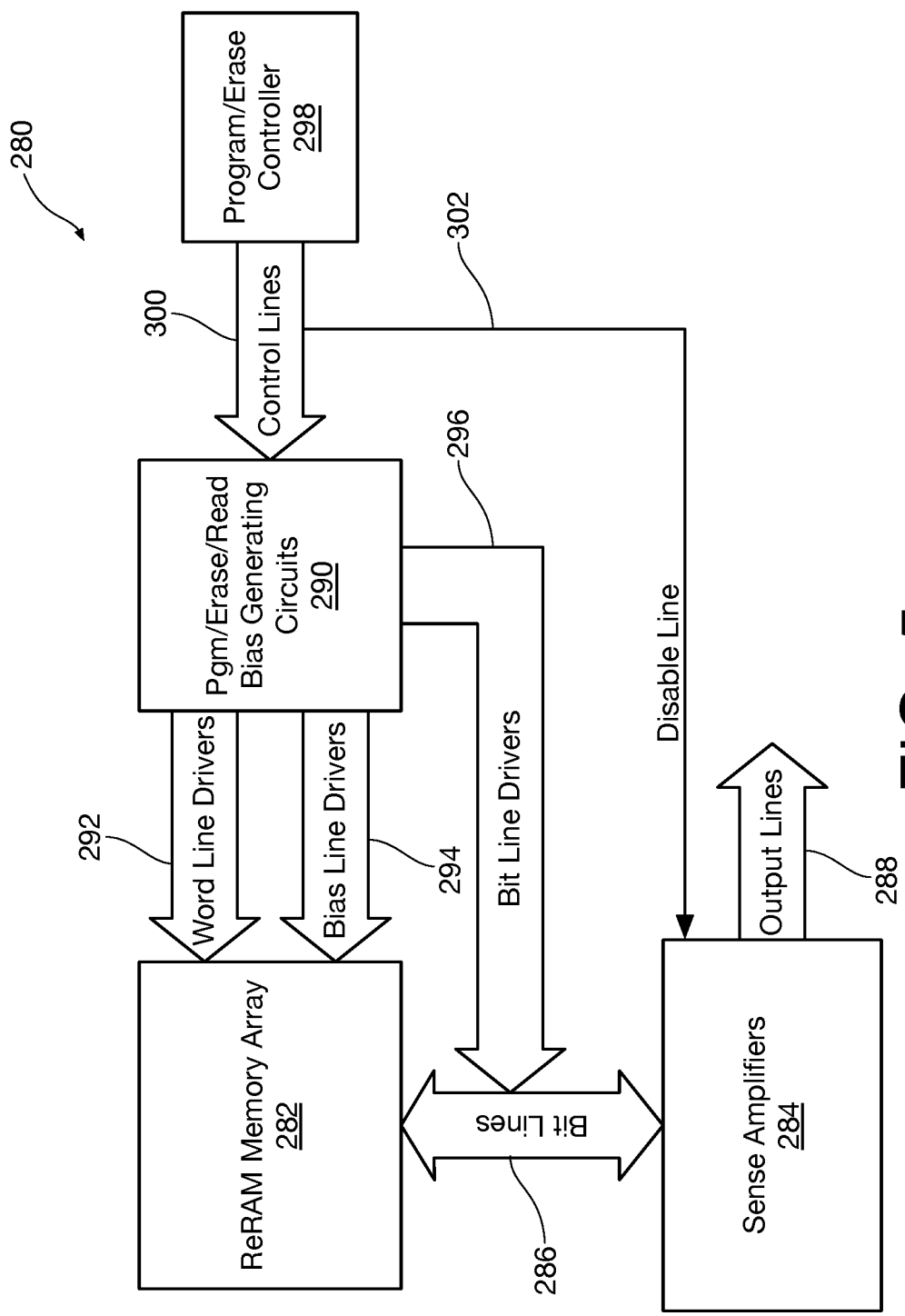
FIG. 5 is a block diagram showing a typical ReRAM memory array and associated read, write, and erase control circuits in accordance with an aspect of the present invention.

Referring now to FIG. 5, a block diagram shows a typical ReRAM memory array system and associated read, write, and erase control circuits in accordance with an aspect of the present invention. The ReRAM memory array system 280 includes a ReRAM memory array 282, driving sense amplifier circuits 284 via bit lines 286. The sense amplifier circuits may be any type of sense amplifier circuits depending on the output voltages/currents present on the bit lines 286 during the read mode operation of the ReRAM memory array 282. Design of particular sense amplifier circuits is well within the scope of ordinary skill in the art. Output of the sense amplifiers is presented on output lines 288.

Reading, programming (writing) and erasing the memory cells in the ReRAM memory array 282 is controlled by the program/erase/read bias generating circuits 290. The program/erase/read bias generating circuits 290 generate the potentials shown in Table 1 to operate the program, erase, and read modes of the ReRAM memory array 282. Design of particular circuits will depend on the particular potentials required and is well within the level of ordinary skill in the art. The potentials necessary to operate the program, erase, and read modes of the ReRAM memory array 282 are driven into the ReRAM memory array 282 to operate the program, erase, and read modes of the ReRAM memory array 282 by word line drivers 292, bias line drivers 294 and bit line drivers 296. Word line driver, bias line driver and bit line driver circuits are known in the art and particular instances of these circuits are easily designed for particular ReRAM memory arrays having specific voltage and current requirements.

Program/erase controller 298 directs the operation of program/erase/read bias generating circuits 290 over control lines 300 by providing timing and other control in a manner known in the art. Persons skilled in the art will appreciate that sense amplifiers 284 are disabled during programming and erase operations by asserting a signal from program/erase controller 298 on disable line 302.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A ReRAM memory array including rows and columns of ReRAM cells, each ReRAM cell in a row and column of ReRAM cells comprising:

a ReRAM device having an ion source end and a solid electrolyte end, the ion source end coupled to a bias line associated with the row of the array containing the ReRAM device;

a first n-channel transistor coupled between the solid electrolyte end of the ReRAM device and a bit line associated with the column of the array containing the ReRAM cell, the first n-channel transistor having a gate coupled to a first word line associated with the row containing the ReRAM cell; and a second n-channel transistor coupled between the solid electrolyte end of the ReRAM device and the bit line associated with the column of the array containing the ReRAM cell, the second n-channel transistor having a gate coupled to a second word line associated with the row containing the ReRAM cell;

wherein the first word line and the second word line associated with the row containing the memory cell are electrically connected together.

2. The ReRAM memory array of claim 1 further including a sense amplifier coupled to the bit line for each column in the array.

3. The ReRAM memory array of claim 1 wherein both the first n-channel transistor and the second n-channel transistor are FinFET transistors.

4. The ReRAM memory array of claim 3 wherein the first n-channel transistor and the second n-channel transistor for each memory cell in a column of the array are formed on the same group of fins.

5. A layout for a ReRAM memory array including rows and columns of ReRAM cells comprising:

for each column of the array a group of fins formed in a semiconductor substrate and running in a first direction;

for each column of the array a bit line in the form of a metal interconnect line running in the first direction;

for each row in the array first and second spaced-apart word lines running in a second direction perpendicular to the first direction, the first word line passing over and electrically insulated from each group of fins and forming gates for a first transistor in ReRAM memory cells in a row of the array, and the second word line passing over and electrically insulated from each group of fins and forming gates for second transistors in ReRAM memory cells in the row of the array;

for each row of the array a bias line in the form of a metal interconnect line running in the second direction;

a plurality of ReRAM memory cells, each ReRAM memory cell formed at an intersection of a row and a column of the array, each memory cell including:

a ReRAM device formed over the group of fins between the first and second word lines having a solid electrolyte end and an ion source end, the solid electrolyte end of each ReRAM device electrically connected to a region of the group of fins for the column of the array containing the memory cell at a location between the first and second word lines for the row containing the memory cell, the ion source end of each ReRAM device electrically connected to the bias line for the row containing the memory cell;

the region of the group of fins electrically connected to the solid electrolyte end of each ReRAM device forming common drains for the first and second transistors in the ReRAM cell, regions of the group of fins outside of the pair of spaced apart word lines forming separate source regions for the first and second transistors in the ReRAM cell, said separate source regions electrically connected to the bias line for the row containing the ReRAM memory cells.

6. The layout for a ReRAM memory array of claim 5 wherein:
except for end regions of the group of fins, the regions of the group of fins outside of the pair of spaced apart word lines also form a common source region for one of a first and second a transistor in another memory cell in the column containing the ReRAM memory cell adjacent to the memory cells.

\* \* \* \* \*